US010389262B2

(12) United States Patent
Jakob et al.

(10) Patent No.: US 10,389,262 B2
(45) Date of Patent: Aug. 20, 2019

(54) DEVICE FOR TEMPORARILY TAKING OVER ELECTRICAL CURRENT FROM AN ENERGY TRANSFER OR DISTRIBUTION DEVICE, WHEN NEEDED

(71) Applicant: GE Energy Power Conversion Technology Ltd, Rugby, Warwickshire (GB)

(72) Inventors: Roland Jakob, Berlin (DE); Martin Geske, Berlin (DE); Kowalsky Jens, Saxony (DE); Josef Lutz, v (DE)

(73) Assignee: GE ENERGY POWER CONVERSION TECHNOLOGY LTD, Warwickshire (GB)

( * ) Notice: Subject to any disclaimer, the term of this patent is extended or adjusted under 35 U.S.C. 154(b) by 0 days.

(21) Appl. No.: 15/429,818

(22) Filed: Feb. 10, 2017

(65) Prior Publication Data

US 2017/0302189 A1    Oct. 19, 2017

(30) Foreign Application Priority Data

Feb. 10, 2016   (EP) ..................... 16155025

(51) Int. Cl.
*H02M 1/08* (2006.01)
*H02M 5/293* (2006.01)
(Continued)

(52) U.S. Cl.
CPC .......... *H02M 5/293* (2013.01); *H02H 7/1213* (2013.01); *H02J 3/36* (2013.01);
(Continued)

(58) Field of Classification Search
CPC .......... H02M 5/293; H02M 2005/2932; H03K 17/06; H03K 17/063; H03K 17/122; H03K 17/127; H02J 3/36; H02H 7/1213
See application file for complete search history.

(56) References Cited

U.S. PATENT DOCUMENTS 7,724,065 B2    5/2010   Bayerer et al.
8,605,400 B2   12/2013   Wetter et al.
(Continued)

FOREIGN PATENT DOCUMENTS

DE          101 03 031 A1   7/2002
DE    10 2010 006 525 B4    2/2012
(Continued)

OTHER PUBLICATIONS

Basler, T., et al., "IGBTs Conducting Diode-Like Surge Currents," Proceedmgs of the 26th International Symposium on Power Semiconductor Devices & IC's, pp. 103-106 (Jun. 15, 2014).
(Continued)

*Primary Examiner* — Alex Torres-Rivera
*Assistant Examiner* — David A. Singh
(74) *Attorney, Agent, or Firm* — Wood IP LLC (57) ABSTRACT

A device (2) for the on-demand commutation of an electrical current from a first line branch (14, 3; 36) to another, second line branch (4; 41; 71) is created, which has a number of power semiconductor switching elements (7; 47; 53), which are arranged in series and/or parallel to one another in the second line branch (4; 41; 71), and a control unit (18; 51) for controlling the number of power semiconductor switching elements (7; 47; 53). The control unit (18; 51) is adapted to apply to each of the number of power semiconductor switching elements (7; 47; 53) an increased control voltage (VGE) whose level is above the maximum permissible control voltage specified for continuous operation, in order to switch on or maintain the conduction of the number of power semiconductor switching elements and to cause an increased current flow through it, whose current rating is at least double the nominal operating current. The control unit (18; 51) is further adapted to switch off the number of power semiconductor switching elements after a respectively pro-
(Continued)

vided short switch-on duration by switching off the control voltage (VGE) again while they conduct an increased current flow. The device (2) can thus be designed for a higher power in operation, or, at a given operating power, the semiconductor area and size of the device (2) can be reduced.

11 Claims, 6 Drawing Sheets

(51) Int. Cl.

| | | |
|---|---|---|
| *H03K 17/06* | (2006.01) | |
| *H03K 17/12* | (2006.01) | |
| *H02M 1/088* | (2006.01) | |
| *H02M 1/32* | (2007.01) | |
| *H02J 3/36* | (2006.01) | |
| *H02H 7/12* | (2006.01) | |
| *H02J 3/38* | (2006.01) | |

(52) U.S. Cl.
CPC ............ *H02M 1/08* (2013.01); *H02M 1/088* (2013.01); *H02M 1/32* (2013.01); *H03K 17/06* (2013.01); *H03K 17/127* (2013.01); *H02J 3/386* (2013.01); *H02M 2005/2932* (2013.01); *H03K 2017/066* (2013.01)

(56) References Cited

U.S. PATENT DOCUMENTS

2008/0197966 A1  8/2008  Sommer
2011/0188162 A1*  8/2011  Wetter .................. H02H 9/041
                                                    361/57
2013/0009491 A1  1/2013  Hafner et al.

FOREIGN PATENT DOCUMENTS

| DE | 10 2010 046 142 A1 | 3/2012 |
|---|---|---|
| EP | 1 497 911 B1 | 10/2005 |
| EP | 2 747 260 A2 | 6/2014 |
| EP | 2 780 923 B1 | 4/2015 |
| WO | 2011/057675 A1 | 5/2011 |

OTHER PUBLICATIONS

Bohllander, M., et al., "Desaturated Switching of Trench—Fieldstop IGBTs," pp. 1-6 (May 2006).

Chaudhary, S.K., et al., "Chopper Controlled Resistors in VSC-HVDC Transmission for WPP with Full-scale Converters," Conference on Sustainable Alternative Energy, pp. 1-8 (Oct. 2009).

Eckel, H.G., and Sack, L., "Optimization of the Short-Circuit Behaviour of NPT-IGBT by the Gate Drive," European Power Electronics and Drives Association, vol. 2, pp. 1-6 (Sep. 9, 1995).

Hafner, J., et al., "Proactive Hybrid HVDC Breakers—A key innovation for reliable HVDC grids," Paper presented at The electric power system of the future—Integrating supergrids and microgrids International Symposium in Bologna, pp. 1-9 (Sep. 2011).

Wang, Y., and Marquardt, R., "Operation of Modular Multilevel Converter and DC-Breaker in large Multiterminal-HVDC-Grids," VDE Verlag GmbH, pp. 541-548 (May 2013).

Extended European Search Report and Opinion issued in connection with corresponding EP Application No. 16155025.6 dated Aug. 18, 2016.

* cited by examiner

DEVICE FOR TEMPORARILY TAKING OVER ELECTRICAL CURRENT FROM AN ENERGY TRANSFER OR DISTRIBUTION DEVICE, WHEN NEEDED

The present invention relates to a device for the on-demand short-term transfer of an electrical current from an energy transmission or distribution device and, in particular, such a device which has a number of power semiconductor switching elements arranged in series and/or parallel to one other on a line branch to which the current is to be commutated on demand.

Power semiconductor components, e.g. insulated gate bipolar transistors (IGBTs), bi-mode insulated gate transistors (BIGTs), metal oxide semiconductor field effect transistors (MOSFETs), etc., are used inter alia to rectify and invert electrical voltages and currents. In general, suitable power converters for this purpose have a number of power semiconductor switching elements. Converters are known in different topologies for different applications, e.g. for the coupling of electrical networks with speed variable drives and for energy exchange between two electrical networks for different power levels.

With continuous development of power semiconductor switches, ever more new power converter and other circuit topologies for ever higher power and voltage ranges are desired and are being developed. In the medium and high-voltage range, e.g. power converters increasingly are used which have a number of power semiconductor switching elements arranged in series and/or parallel to one another to create a high blocking capacity and/or a high current carrying capacity for the respective applications and to increase the voltages to the highest level up to the high-voltage direct current (HVDC) transmission ranges. Modular multipoint power converters have also been developed which have a number of identical cells or submodules in each branch, each of which is formed by a bridge circuit with energizable power semiconductor switches and an internal capacitor for interim storage of electrical energy. Due to the modular design, the power converter is individually scalable for different performance and applications. Modular multipoint power converters are known, e.g. from DE 101 03 031 A1, DE 10 2010 046 142 A1 or EP 1 497 911 B1.

In very high power ranges, an increasingly large semiconductor area is required for the semiconductor power components, which results in a correspondingly large construction volume and high costs of the power converters. The expenses of cooling and controlling the power converters also increases considerably. There are applications in which power converters are used at high powers, but only for relatively short operating times. There is a desire to increase the transmissible power for these applications without increasing the complexity of the circuit configuration and the control of the power converter. Vice versa, there is a desire to reduce the semiconductor surface area of the power converters for such applications, and the costs and effort of the implementation and operation of the power converters, and to make better use of the power semiconductor components, for a given high nominal power of the power converters.

Apart from power converters, there are numerous other applications in which a number of series-connected and/or parallel-connected power semiconductor switching elements are used to permit high current loads and blocking voltages. For example, frequency inverters are used for the supply of motors of so-called "brake choppers" for the monitoring and control of the intermediate circuit voltage. With the braking processes of such motors, generator current can flow back via the motor-side power converter into the intermediate circuit and lead to an intermediate circuit voltage above the permissible values. If the intermediate circuit voltage exceeds a threshold voltage, the brake chopper is electronically connected for a short time, to which a so-called brake resistor is connected, which converts the excess energy in the intermediate circuit into thermal energy, thus limiting the maximum intermediate circuit voltage. This operation is repeated as required. For high power ranges, it may also be necessary here to implement the electronic switch of the brake chopper with a number of series-connected and/or parallel-connected power semiconductor switching elements.

Similar chopper resistor devices can also be used in HVDC systems (see S. K. Chaudhary et al., "Chopper Controlled Resistors in VSC-HVDC Transmission for WPP with Full-scale converters", Sustainable Alternative Electricity (SAE), 2009 IEEE PES/IAS Conference on pages 1-8) or also in DC transmission systems up to the medium voltage range for power converters which convert the DC voltage received via HVDC lines into an alternating voltage power suitable for a downstream distribution or supply network. If a fault occurs in the downstream alternating voltage network and the power transmission to the network is impeded, the chopper resistor devices can also limit surge voltages in the HVDC line or in the power converter systems by short-term consumption of excess energy in a connected resistor. In particular, in the case of high-voltage and high-power applications, an enormous semiconductor use and an enormous size are required, which can be proportional to the entire power converter in the high single-digit percentage range. The costs and effort for implementation and operation are significant. A reduction of these while ensuring stable, robust operation would be desirable.

In addition, DC disconnecting switches for HVDC systems are known which use a number of series-connected power semiconductor components. For example, so-called hybrid DC power switches are known from WO 2011/057675 A1 and EP 2 780 923 B1 which are based on a combination of an electronic main switch and a series circuit of an electronic auxiliary switch, connected in parallel to it, with a fast mechanical disconnecting switch. Both the auxiliary switch and the main switch have a number of series-connected power semiconductor switching elements, the number of which is lower in the case of the auxiliary switch, such that it is set up for a lower nominal power and lower conduction losses than the main switch. In normal operation, the auxiliary switch and the mechanical disconnecting switch are closed, while the main switch can be opened or closed. The current thus always flows through the low-resistance main current path without the occurrence of a fault. For example, if a short-circuit fault is detected within the DC voltage transmission path or the DC voltage network, the hybrid circuit breaker is triggered by first opening the auxiliary switch, whereby the current is commutated from the main current path to the bypass path with the main switch. Subsequently, the mechanical disconnecting switch is opened to disconnect the auxiliary switch from the transmitted voltage, and then the main switch is opened, resulting in commutation of the current from the bypass path to a surge arrester arranged in parallel to the main switch.

Such hybrid DC power switches allow the fast opening and isolation of defective parts of transmission links and the resetting of fault-free parts with low power losses. The main switch, which can have at least 2 or more and, depending on the required blocking voltage, even as many as 10 or more than 50 power semiconductor switching elements for HVDC applications, is only used for a short time when the hybrid switch is triggered. Its conduction losses play hardly any role. However, such hybrid switches for an HVDC application can have an enormous semiconductor area for the main switch and a large overall constructed space for the hybrid switch as required by its cooling and control devices. This constructed space can also be used in the high single-digit percentage range as compared to an entire power converter. Here too, it is desirable to reduce the semiconductor area and the constructed space and lower the implementation and operating costs.

IGBTs are characterized by a nominal current IC nom. Their typical operating range is up to twice the nominal current. Three-phase nominal current can also be switched off if necessary. In addition, IGBTs are described by a short-circuit current ISC which, depending on the IGBT, is three times to five times the nominal current IC nom. It was found that, with an increased gate-emitter voltage, currents of more than three times the nominal current IC nom can also be switched.

For example, it is known from DE 10 2010 006 525 B4 and EP 2 747 260 A2 that semiconductor switches which can be disconnected again, in particular IGBTs, can be operated outside the specified parameters for a short time to avoid desaturation and permit high load currents. DE 10 2010 006 525 B4 describes a device for the derivation of surge currents or transient surge voltages, e.g. as a result of a lightning strike with a re-disconnectable semiconductor switching element, whereby the switching-on is achieved by the static application of a gate-emitter voltage outside of the range specified for its gate-emitter voltage for continuous operation. Usually, IGBTs are operated at an operating point at a gate-emitter voltage VGE=15 V, whereby, according to the manufacturer's specification, the gate-emitter voltage may typically not exceed 20V for continuous operation, otherwise the lifetime of the thin insulating oxide layer under the gate is limited. For the short-term or transient surge currents due to lightning strikes, an increased gate-emitter voltage of e.g. 30V-50V is suggested. The switching element is switched off again after the short-term or transient surge current has decayed.

EP 2 747 260 A2 describes a three-phase power converter with IGBTs as a power semiconductor switch, whereby, in the event of a short-circuit in one of the branches of the power converter, the IGBTs of the other fault-free branches are permanently switched with conduction by applying to them an increased gate emitter voltage in a range between about 30V and about 70V, outside the allowable specified range. As a result of the increase in the branch currents in the fault-free branches, balancing of the short-circuit currents can be achieved by the motor, and commutation torques in the motor can be prevented.

Based on this, an object of the present invention is to provide a device for the short-term transfer of electrical current from an energy transmission or distribution device which is set up to transmit very high powers for a short time on demand. In particular, it is an object of the present invention to suggest simple steps to maximize the transmissible performance of such a device for on-demand short-term transfer and/or to reduce the effort and costs for the implementation and operation of the device for a given transmissible power. This must be done in a safe and robust manner.

This object is achieved by means of a device for the short-term on-demand transfer of an electrical current from an energy transmission or distribution device with the features of claim 1, and by using a series circuit and/or parallel circuit of a number of power semiconductor switching elements according to claim 13. Particularly advantageous embodiments of the invention are the subject of the dependent claims.

According to one aspect of the invention, a device is provided for the short-term on-demand transfer of an electrical current from an energy transfer or distribution device, comprising at least one line branch connected to the energy transfer or distribution device, a number of power semiconductor switching elements arranged in series and/or parallel to one another in the at least one line branch, and a control unit for driving the number of power semiconductor switching elements. The control unit is adapted to apply to each of the number of power semiconductor switching elements an increased control voltage whose level is above the maximum permissible control voltage specified for continuous operation, in order to switch on the number of power semiconductor switching elements and to cause an increased current flow through it, whose current rating is at least double the nominal operating current. The control unit is also adapted to switch off the number of power semiconductor switching elements by switching off the control voltage while they conduct an increased current flow.

The invention is based on the fact that, in applications in which the current during operation must be commutated only for a short time to the number of power semiconductor switching elements arranged in series and/or parallel to one another, due to the greater current carrying capacity of the power semiconductor switching elements as a result of exceeding the increased control voltage above the permissible limit values, the semiconductor surface area thereof and thus the entire constructed space of the device for a given high power to be transmitted can be reduced significantly. This can reduce the costs of the implementation, cooling and operation of the device, thus reducing the implementation and operating costs.

In the above-mentioned device, the positive control voltage is preferably selected such that it is briefly at least over 1.5 times the maximum control voltage permitted by the manufacturer. It can be up to 4 times or even more than the maximum permissible control voltage.

In addition or alternatively, the current rating to be switched off may be above the given short-circuit current ISC at the recommended positive control voltage VGE and generally up to 14 times, and possibly up to at least 20 times, higher than the specified nominal current (IC nom). In laboratory tests, 27 times the nominal current was able to be switched off successfully.

In preferred applications, the power semiconductor switching elements used are preferably formed from IGBTs, which offer the advantages of voltage-controlled switching behavior, as in MOSFETs, with good transmission behavior due to bipolar operation, as in bipolar transistors, and a low control power, and in the meantime they are available for high powers with currents in the kA range and voltages in the kV range. This allows applications of the device according to the invention for high-power applications, e.g. high-voltage direct current (HVDC) transmission, such that the energy transmission or distribution device can be, e.g. an HVDC line. In the case of IGBTs, the operating point for continuous operation is generally a control voltage or gate-emitter voltage of approximately 15V, whereas the specified maximum permissible gate-emitter voltage is generally 20V. According to the invention, the gate-emitter voltage is selected for the line-to-line switching of the series and/or parallel circuit of power semiconductor switching elements at 30 to 50V or even above that, up to approximately 70V, making it possible to reduce the required semiconductor area by one half or even more. The increased current then flowing through the series and/or parallel circuit of the power semiconductor switching elements in operation is greater than twice the nominal operating current, and may even be five times or up to ten times or more than the nominal current. With the use of IGBTs, a multiple of the nominal current can also be reliably and safely interrupted by switching off or removing the gate-emitter voltage. If necessary, this is supported by additional steps, as also explained below.

In principle, it is also possible to operate other power semiconductor switching elements other than IGBTs, e.g. BIGTs, MOSFETS, etc., in the manner according to the invention. In a particularly preferred embodiment, the device according to the invention is part of a hybrid direct current (DC) power switch, preferably for HVDC applications, comprising a main current branch connected in series to the energy transmission or distribution device or inserted into the latter, which has a series circuit made of an electronic auxiliary switch and a fast mechanical circuit breaker, and a bypass branch connected in parallel to the main branch and having an electronic main switch having the number of power semiconductor switching elements. Such hybrid DC power switches are known per se, but are operated within the specified parameter ranges. The invention makes it possible to reduce the semiconductor area significantly for hybrid DC power switches of this type, which also reduces the overall constructed space significantly, as well as the overall implementation and operating costs for the hybrid DC power switches.

In one implementation, the electronic auxiliary switch can have one or more series-connected power semiconductor switching elements, preferably IGBTs, whose overall design permits a lower nominal power and lower conduction losses than the series circuit and/or parallel circuit of the number of power semiconductor switching elements of the main switch. The main switch can have a series circuit of power semiconductor switching elements (7). For high-voltage applications, including HVDC, it may also have at least 10, and preferably at least 50, or even 100-200, power semiconductor switching elements to provide the required blocking capacity. For example, the series-connected power semiconductor switching elements of the main switch must be designed, in HVDC applications, for transmitted DC voltages of e.g. 300-400 kV or even higher voltage levels and for currents of e.g. 1,000-1,500 A. The present invention makes this possible with relatively little effort and cost-effectively. For example, according to the prior art at 600 kV and a design to a power of 1 GW, a current must be designed for around 1,670 A per single IGBT element. The invention now allows e.g. 5 times the current per single IGBT element. Therefore, a design of 1670/5=334 A, during switch-off of the 10-fold current at 167 A, would be sufficient. Since the costs and the constructed space are proportional to the current, the costs can be reduced to one-fifth or one-tenth. The hybrid DC power switch according to the invention can be operated in normal operation such that the auxiliary switch is switched conductively and the fast mechanical disconnecting switch is closed, while the main switch is in the non-conductive state. For this purpose, it can be opened or pre-energized with a nominal control voltage. Since the impedance of the electronic main switch is considerably higher than that of the auxiliary switch, the current flows almost exclusively through the main current branch. If a fault, e.g. a short-circuit fault, is detected in the energy transmission or distribution device, the electronic auxiliary switch is first opened. At the same time, the power semiconductor switching elements of the electronic main switch are energized with the increased control voltage to commutate the current to the bypass branch with the main switch. Subsequently, the fast mechanical switch is opened to isolate the auxiliary switch from the transmitted voltage, and then the electronic main switch is opened by disconnecting the increased control or gate-emitter voltage to interrupt the increased current flow in the bypass branch. The current then commutates e.g. to an arrester or nonlinear resistor parallel to the power semiconductor switching elements, where its energy is converted into heat.

In a further preferred embodiment, the device according to the invention is part of a two-stage or multistage power converter, preferably for HVDC or other high-power applications. The power converter may have one or more phase shunts connected in parallel, each phase shunt having at least two series-connected electronic switches which are controlled by the control unit according to a specific pulse pattern to convert a first power with first current and voltage characteristics into a second power with second current and voltage characteristics.

In one configuration, the at least two series-connected electronic switches each can have a number of power semiconductor switching elements connected in series and/or in parallel, which, in the normal operation of the power converter, are energized with the increased control voltage, e.g. gate-emitter voltage in the case of IGBTs, according to the specific pulse pattern. Thus, in applications in which a power converter designed for high powers is operated only temporarily or for a short time, the semiconductor area and the costs for the implementation and operation of the power converter can be reduced substantially. The constructed space and weight of such components can thus be reduced significantly. Many applications are conceivable in which the necessary service life or usage duration is relatively limited from the outset and are suitable for the temporary or short-term application of increased control voltages.

In a further preferred embodiment of the invention, the power converter can have a chopper resistor device for protection against surge voltage in a DC voltage intermediate circuit of the power converter, which is connected in parallel to the one or more parallel branches of the power converter and a series circuit comprising at least one resistor and one electronic switch. The electronic switch is formed from the number of power semiconductor switching elements connected in series and/or in parallel, which, when the voltage in the DC voltage intermediate circuit exceeds a predetermined threshold voltage, is controlled for a short time, pulse-wise, if necessary repeatedly, e.g. by pulse width modulation (PWM), with the control voltage (e.g. gate-emitter voltage with IGBTs). Such a chopper resistor device with many series-connected and/or parallel-connected power semiconductor switching elements can e.g. be used for protection against surge voltage in inverters with central or decentralized intermediate circuits. However, it can also be used as a brake chopper device for drive systems to convert excess energy during braking into thermal energy via a connected braking resistor. In any case, the size of the chopper resistor device can be reduced significantly by providing the increased control voltage. The required semiconductor area can be reduced to one-fifth or even less. The implementation and operating effort and the associated costs are reduced.

In addition, the device according to the invention can also be designed as a so-called "crowbar", which is an electronic clamp circuit used as protection against surge voltage, in particular in low-voltage direct current supplies. Crowbars have thyristors or triacs as switching elements which, when a certain voltage is reached, short-circuit the supply voltage at low impedance such that e.g. a fuse can trip and interrupt the power supply or act to limit the voltage for the power converter component to be protected. By replacing the thyristors or triacs by series and/or parallel switching of IGBTs, etc., the crowbar can also be used for medium or high voltages and can be operated according to the invention with a very high control voltage. The crowbar may also be connected between the phases of a three-phase system. In addition, the crowbar itself can be a component of the actual power converter circuit for converting electrical energy.

In an advantageous development of the invention, the control unit can be adapted to control the number of power semiconductor component elements between the switching on and the final switching off with a control voltage on at least one intermediate level, which is below that of the increased control voltage at the time of switching on, but above the maximum permissible control voltage specified for continuous operation. Intermediate stages of the control voltage can thus be added, such that the IGBTs can first be energized with +50V for switching on, then with a voltage in the range 20 to 30V as an intermediate stage and finally with −15V for the final switch-off. Several intermediate stages, e.g. to +30V and then to +20V, are also possible. This allows switching losses and the switch-off time to be controlled and the switching process to be optimized according to the application and the operating environment. For example, the di/dt and dv/dt processes for the collector current and the collector-emitter voltage can be optimized and surge voltages minimized. It is also possible to achieve a desaturation of the IGBTs with a suitable intermediate stage just before the final switch-off to reduce the switch-off losses and the associated peak blocking temperature during switch-off, or also to reduce the switch-off surge voltage and improve the robustness of the power semiconductor components used. Further steps can be implemented in the control unit to reduce voltage surges (overvoltages) during the switching off of the number of power semiconductor switching elements and to promote a safe disconnection of high currents, which can be two or more times higher than the nominal current. These steps include e.g. active control of the switch-off speed via a gate resistor (so-called soft turn-off) or a number of gate resistors for IGBTs, soft turn-off by reducing the gate-emitter voltage or urge voltage limitation by a voltage clamp (so-called active clamping), all of which are well known in the prior art. In conjunction with the increased control voltage according to the invention, these steps can improve the functional safety and robustness of the device.

In a further aspect of the invention, use is made of a series circuit and/or parallel circuit of a number of power semiconductor switching elements, in particular IGBTs, in a device for the short-term on-demand transfer of a current from an energy transmission or distribution device. The device has at least one power branch, which is connected to the energy transfer or distribution device and in which the series circuit and/or parallel circuit of the number of power semiconductor switching elements is arranged. The number of power semiconductor switching elements are energized in operation, if necessary, preferably all, with an increased control voltage whose height is above the maximum permissible control voltage specified for continuous operation to switch on the number of power semiconductor switching elements and cause an increased current flow through them, whose current intensity corresponds to at least double the nominal operating current. After a short-term duty cycle, the number of power semiconductor switching elements are switched off again by switching off or removing the control voltage while they lead to an increased current flow.

In a preferred embodiment, the power semiconductor switching elements are IGBTs, and the magnitude of the increased control voltage, i.e. the gate-emitter voltage, is determined as a function of a predetermined total lifetime until the breakdown of a gate oxide layer between a gate and an emitter of the power semiconductor switching elements, with an estimated total duty cycle of the power semiconductor switching elements being selected as the sum of the estimated duty times of all expected switch-on processes, taking into account a reduction in the lifetime estimated based on the expected switching-on processes and short-term elevated working temperatures to achieve the predetermined lifetime without causing damage to the power semiconductor switching elements. For example, studies have shown that doubling the gate-emitter voltage from usually 15V to 30V can reduce the lifetime by a factor of around 300. Considering the influence on the lifetime of the device, it can be seen whether the gate-emitter voltage of 30V must be used or whether an even higher gate-emitter voltage can be applied.

In addition, preferred applications according to the invention relate to the use of the series and/or parallel circuit of the power semiconductor switching elements in a hybrid direct current (DC) power switch, their use as the high-frequency clocked switches of a power converter or their use as the electronic switch of a chopper resistor device, e.g. for power converters to high-voltage direct current (HVDC) lines, or as a brake chopper on the intermediate circuit of a power converter of a drive system or as a crowbar. With regard to the embodiments and further developments of the application according to the invention and its advantages, reference is made to the above statements in relation to the device according to the invention, which apply analogously here.

Further advantageous details of embodiments of the invention result from the dependent claims, the drawings and the associated description. The invention is described in more detail below with reference to a drawing, which shows exemplary, non-limitative embodiments of the invention, whereby identical reference numerals are used in all figures to designate identical elements. Description:

Figure 1:
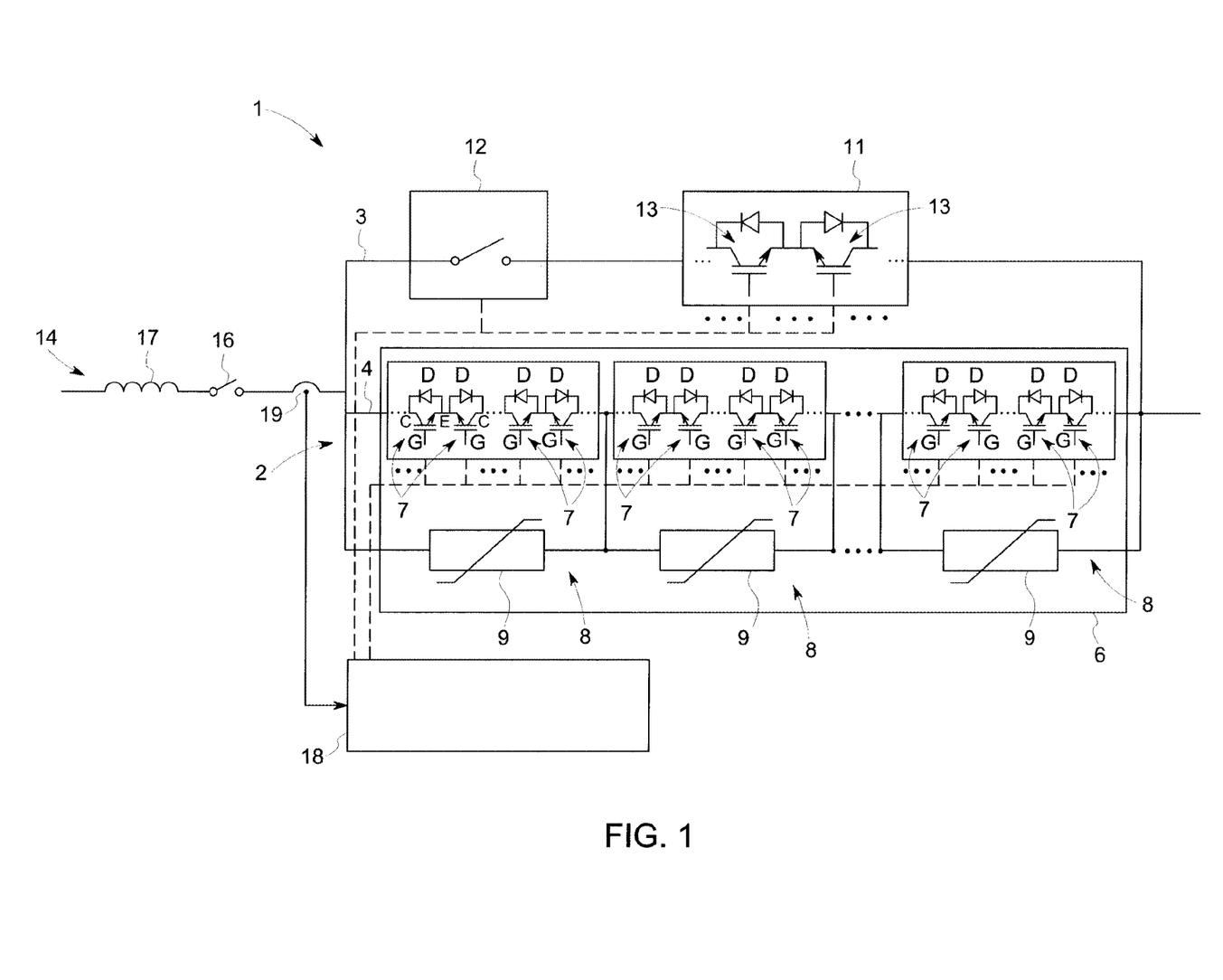
FIG. 1 shows a hybrid direct current (DC) power converter, comprising a number of series-connected power semiconductor switching elements, according to a first embodiment of the invention, in a greatly simplified representation.

FIG. 1 shows a hybrid direct current (DC) power converter 1, which forms a first preferred embodiment of a device 2 for on-demand short-term transfer or commutation of an electrical current according to the invention. The hybrid DC power switch 1 can be used as a so-called "DC breaker", e.g. in high-voltage direct current transmission (HVDC) systems, such that, in the case of a short-circuit in a downstream part of the DC network, the defective part can be isolated quickly and safely to continue to maintain the function of other parts of the system. Existing mechanical DC disconnecting switches are not able to completely interrupt the DC within a few milliseconds, as is required in HVDC applications. They also require complex steps to prevent or extinguish arcing when opening the disconnecting switch. Semiconductor-based DC breakers can be switched very quickly and without arcing. The hybrid DC power switch 1 overcomes these shortcomings and is able, in high-voltage applications of 50 kV or more, e.g. in an HVDC system with a network voltage of 300-400 kV, to reliably interrupt currents in the kA range, e.g. up to 10 kA or more.

The hybrid DC power switch 1 has a main current path 3 and a bypass branch 4 parallel to this. The bypass branch 4 has a main electronic switch 6, which here comprises a number of mutually series-connected power semiconductor switching elements 7. According to the DC voltage of the application and the performance data of the power semiconductor switching elements 7 used, the series circuit can comprise several tens or even several hundred power semiconductor switching elements 7. As illustrated, power semiconductor switching elements 7 are preferably provided for both current flow directions, whereby bidirectional power semiconductor switches can be used here which are commonly available in different configurations. If the polarity of the current is determined, then conventional unidirectional switches can also be used.

The semiconductor-based main switch 6 is divided into number of sections with 8 individual surge voltage or surge current arresters 9, which are arranged parallel to the number of series-connected power semiconductor switching elements 7 and formed from nonlinear resistors.

The main current branch 3 has a series circuit of an electronic auxiliary switch 11 and a fast mechanical disconnecting switch 12. The electronic auxiliary switch 11 is also semiconductor-based and has a number of power semiconductor switching elements 13 which are preferably also equipped for bidirectional current transmission. The auxiliary switch 11 is adapted for significantly lower blocking voltage than the main switch 6 and, for this purpose, preferably has a series circuit of power semiconductor switching elements 13, the number of which is significantly lower than in the main switch 6. Optimally, only a single switch is used in series. It can be designed for lower voltage than the switch 7. If the polarity of the current and thus the direction of energy flow is determined, then a conventional unidirectional switch can also be used. The switch 11 may also consist of elements other than the elements 7, e.g. GCTs.

The fast mechanical disconnecting switch 12 is capable of fast switching in the millisecond range and can be based e.g. on a known gas-insulated switching technology, etc. As FIG. 1 further shows, in an energy transmission or distribution device, represented here by a transmission line 14, in which the hybrid DC power switch 1 is inserted, a residual current protection switch 16 can further be provided, which serves to trigger the hybrid DC power switch 1 to interrupt a residual current flowing in the line 14. Further, a current-limiting choke 17 can be provided to limit the rise in current in the case of a short-circuit, e.g. in a DC power network or a busbar, to which the hybrid DC power switch 1 is connected.

As can be further seen in FIG. 1, a control unit 18 is provided which serves to control the components of the hybrid DC power switch 1 in operation. The control unit 18 can monitor and control the overall operation of the hybrid DC power switch 1 and may for this purpose e.g. monitor the current flow through the line 14 with a current sensor 19. The control unit 18 could also monitor currents in the main current branch 3, and the bypass branch 4, as well as the voltage potentials at these on demand (not illustrated). The control unit could itself be controlled by a superordinate control device (not illustrated in detail here), which can take over the task of monitoring and controlling the hybrid DC power switch 1, while the control unit 18 can only generate and create the appropriate control signals for the power semiconductor switching elements 7, 13. The control unit 18 could also be subdivided into several control subunits assigned to the individual power semiconductor switching elements 7 or to a group of them (not illustrated).

The hybrid DC power switch 1 described so far functions as follows:

During normal operation, the fast mechanical disconnecting switch 12 is closed and the power semiconductor switching elements 13 of the electronic auxiliary switch 11 are also closed or switched on so as to be conductive. With the DC power switch 16 closed, the current then flows only through the main branch 4 and the switches 11 and 12 arranged therein. The electronic main switch 6 can be closed, i.e. switched on so as to be conductive, or opened, and thus rendered nonconductive. Since it has a much greater impedance than the auxiliary switch 11, then no current flows through the bypass branch 3.

When a direct current fault occurs, in particular a short-circuit in the downstream DC power network, the auxiliary switch 11 is energized by the control unit 18 or other control device to open or move into the nonconductive state. Thus, the current flowing through the main current branch 3 commutates to the bypass branch 4. Once the auxiliary switch 11 is not conductive within a few microseconds, and the entire current is commutated to the bypass current branch 4, the fast mechanical disconnecting switch 12 is opened. With the mechanical disconnecting switch 12 opened, the main switch 6 can then interrupt the fault current.

Once the main switch 6 is opened by the control unit 18, the current commutates to the parallel arresters 9 and is converted into heat. After the current has largely decayed, the DC power switch 16 is opened on demand to completely interrupt the current flow.

The mechanical disconnecting switch 12 isolates the auxiliary switch 11 with regard to the primary voltage across the main switch 6 while the current is interrupted. Thus, the required nominal or blocking voltage of the auxiliary switch 11 is reduced significantly. In the conductive state, the auxiliary switch 11 has forward voltages in the range of comparatively few volts, such that the transmission losses of the hybrid DC power switch 1 are greatly reduced compared to a purely semiconductor-based circuit breaker. The high power losses of the main switch 6 that apply only during the short duration of the commutation of the current in the main switch 6 and further on the arrester 9 in a triggering of the hybrid DC power switch 1, are insignificant.

To provide the required blocking voltage, the electronic power switch 6 requires a number of power semiconductor switching elements 7 that receive the current load in the case of short-circuit. In HVDC applications with a voltage of 300-400 kV and e.g. IGBT semiconductor switches as the power semiconductor switching elements 7 with performance data of e.g. 1.5 kA/3.3 kV, up to 200 IGBT switches or more are required for the implementation of the main switch 6. This represents an enormous semiconductor area, which increases the implementation costs enormously. Moreover, additional devices are required for cooling the hybrid power converter 1 and to monitor and control it. A hybrid DC power switch 1 for HVDC applications can proportionally achieve a high single-digit percentage easily on the overall power converter. The present invention makes it possible to significantly reduce this size and the effort and costs associated with the implementation and operation of the hybrid DC power switch 1.

Before discussing the invention in more detail, it should be noted that FIG. 1 illustrates IGBTs T as the power semiconductor switching elements 7. IGBTs are commonly known, are characterized by a particularly good switching behavior, good transmittance and a low control power and are used for different power ranges during operation. Each IGBT T has a control electrode, called gate G, and an emitter E and a collector C, as further electrodes. Advantageously, an internal free-wheeling diode is connected antiparallel to the IGBT T to which a current can be commutated if required. However, in principle, other power semiconductor components, e.g. BIGTs, MOSFETs, etc. are used according to the invention. The terms collector, emitter and gate used herein thus refer to the preferred use of IGBTs as the power semiconductor switching elements 7 (and 13), whereas for the person skilled in the art, the corresponding designations for terminals and electrodes of other similar semiconductor components are commonly used.

As mentioned above, the hybrid DC power switch 1, in particular its main switch 6, according to the invention must be optimized to the required semiconductor area, the space requirements and the associated implementation and operating costs. For this purpose, the control unit 18 is adapted to the power semiconductor switching elements 7 or IGBTs T of the main switch 6 on the triggering of the hybrid DC power switch 1 with an increased control voltage and gate-emitter voltage VGE, the height of which is above the maximum control voltage specified for continuous operation. In general, IGBTs are operated for continuous operation with a gate-emitter voltage of around 15V. According to the manufacturer's specifications, the gate-emitter voltage for continuous operation may typically not exceed 20V, as this could otherwise lead to a breakthrough of the thin insulating gate oxide layer under the gate G, causing destruction of the IGBT.

According to the invention, the IGBTs 7 of the main switch 6 for a commutation of the short-circuit current from the main current branch 3 to the bypass branch 4 can be operated by applying an increased gate-emitter voltage which is greater than the maximum permissible 20V and is e.g. 30V or 50V. If necessary, if statistically few short-circuits are reported in the DC power network, a gate-emitter voltage of 70V can also be selected for the operation of the main switch 6.

This increased control voltage has the result that each IGBT T of the main switch 6 can cause increased currents compared to the nominal operating current, which can be at least two times and even up to ten times or more the nominal operating current. After this increased current flows for only a short time after the commutation of the current from the main current branch 3 to the bypass branch 4 until the complete opening of the main switch 6, in general for a time shorter than a millisecond, or only a few milliseconds, the slight impairment of the insulating gate oxide layer in operation can be accepted, while still ensuring a sufficient lifetime of the hybrid DC power switch 1.

With the inventive step, the increase of the control voltage over the maximum allowable range specified for continuous operation, the hybrid DC power switch 1 can thus be used for higher transmitted DC voltages in the network. Vice versa, the number of similar power semiconductor switching elements 7 in the main switch 6 for the designed current load can be significantly reduced, and in particular can be reduced by half or even more.

This results in a corresponding reduction in the required semiconductor area and the associated costs of the main switch 6 as such and the hybrid DC power switch 1 in general. Also the effort and the costs associated with cooling, monitoring, control equipment, lines, etc., which are necessary for cooling, control and operation of the hybrid power converter 1 can be reduced significantly.

Figure 2:
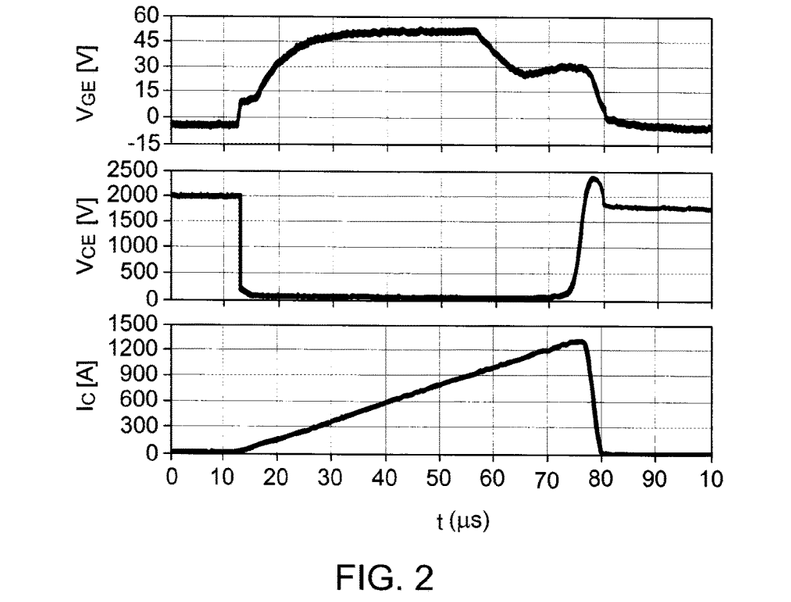
FIG. 2 shows measured voltage and current processes in the switching of a power semiconductor switching element, which is usable e.g. in the hybrid DC power switch according to FIG. 1 to illustrate the principle of embodiments of the invention.

FIG. 2 shows measured processes of the voltage and current signals in switching an IGBT 7 on and off, as can be used in the main switch 6 of the hybrid DC power switch 1 of to FIG. 1, corresponding to the control method according to the invention. In particular, it shows a measurement of the switch-off of an IGBT specified on the nominal current IC nom=50 A at a collector current IC of 1,350 A, i.e. 27 times the nominal current. It shows the gate-emitter voltage VGE, the collector-emitter voltage VCE and the collector current IC over time t.

Before switching on, VGE=−5V, the DC link voltage is 2,000V. At t=12 μs, a positive gate voltage VGE=50V is applied. The current rises according to the inductance of the load. At t=56 μs, the switch-off signal is set. VGE drops to the Miller plateau, which now appears at around 30V with the increased current. The IGBT now starts to desaturate at around t=65 μs. According to the still rising current IC, VGE continues rising a little in the Miller plateau. The current IC likewise increases. Finally, a current IC of 1,350 A an is switched off successfully, which corresponds to 27 times the nominal current of 4.5 kV IGBT chips. At the end of the process, the gate voltage falls again to the applied −5V.

Figure 3:
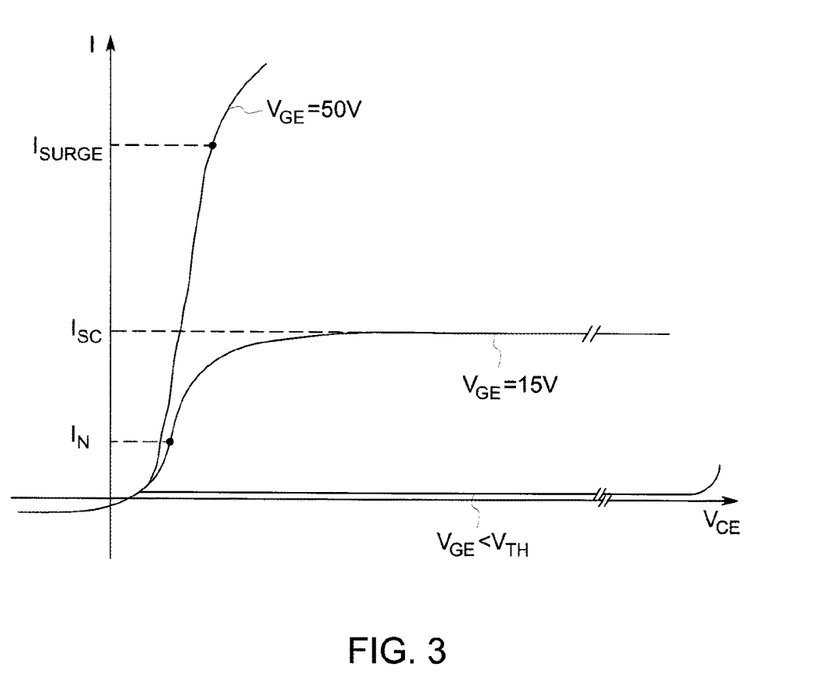
FIG. 3 shows a schematic representation of an output characteristic curve of an IGBT illustrating a so-called "SURGE" operation (overload operation) in a greatly simplified schematic representation.

Similarly, the destruction limit of the IGBT is shifted upward during operation with increased gate voltage. FIG. 3 shows a schematic representation of an output characteristic curves of an IGBT, which shows that the so-called SURGE operation (overload operation) of the IGBT at an increased gate voltage of e.g. 50V here falls within the saturation area. Accordingly, a safe distance must be maintained with regard to the respective application, which provides a sufficient distance from the destruction limit in the active area. Considering these criteria, a surge operation is made possible for transient overload cases with a "surge" current I Surge, which corresponds to 5 to 25 times the nominal current IN and a multiple of the short-circuit current ISC, at a gate-emitter voltage significantly higher than the gate-emitter nominal voltage.

Figure 4A:
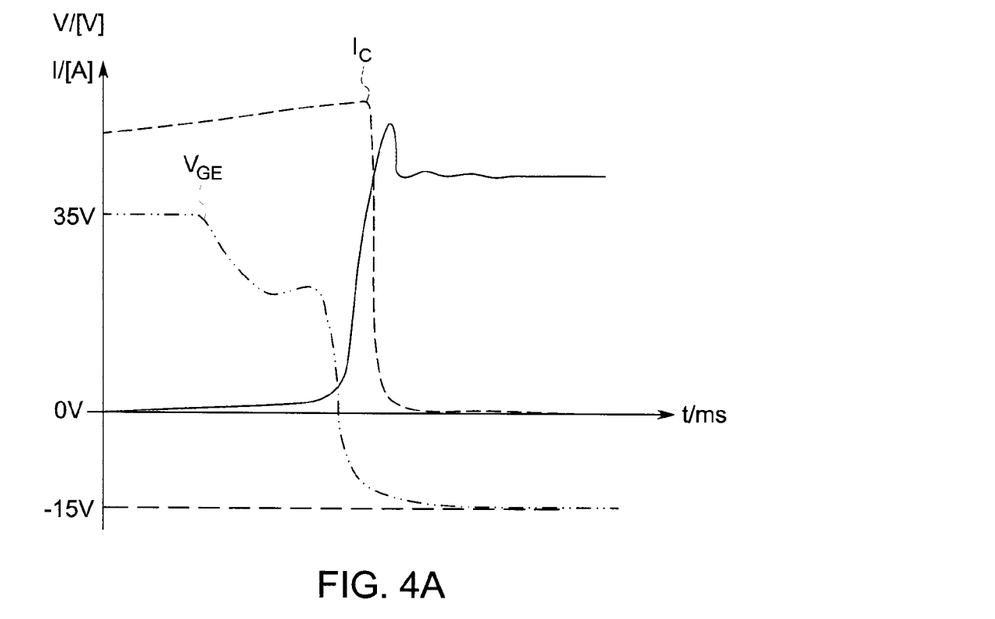
FIGS. 4a and 4b show voltage and current processes similar to FIG. 2 to illustrate further developments of embodiments of the invention, in a greatly simplified representation.
Figure 4B:
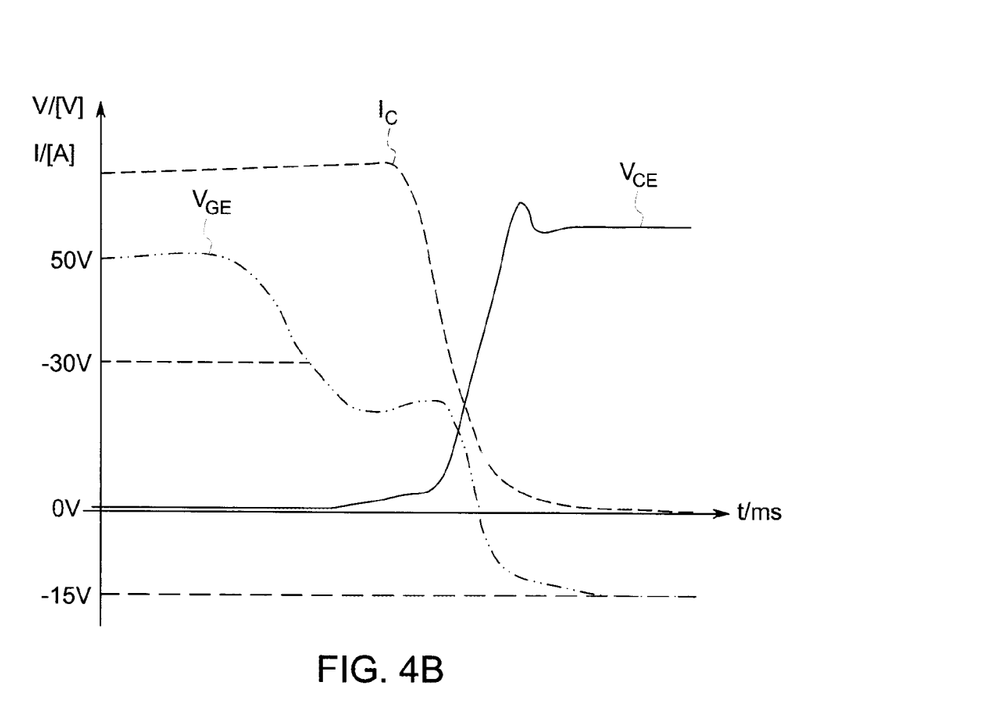

FIGS. 4a and 4b show voltage and current processes similar to FIG. 2, but limited to the switch-off of an IGBT, in order to illustrate further developments of embodiments of the invention in a greatly simplified representation. FIG. 4a shows that a gate-emitter voltage VGE above the maximum permissible voltage for continuous operation of e.g. 35V is applied. Thus, e.g. five times the nominal operating current can be passed through the IGBTs of the main switch 6 of the hybrid DC power switch 1 according to FIG. 1. Nevertheless, this high current can be switched off safely.

As can be seen, the collector current IC falls relatively quickly, with a high slope, when the VGE is switched off. Further, it can be seen that the collector-emitter voltage VCE increases relatively quickly, with a high slope, up to the blocking voltage. Shortly before reaching the blocking voltage, VCE shows an interrupting voltage peak (voltage excess). The interrupting voltage is dependent on the leakage inductance and the thus induced voltage in this according to the switched di/dt and the switch-on voltage peak of the diode.

Such high collector current slopes di/dt, collector voltage slopes dv/dt and voltage excesses may damage the IGBT and cause increased switching losses. The control unit 18 can also arranged according to embodiments of the invention to optimize the di/dt and dv/dt processes, minimize surge voltages and reduce switching losses as well as to influence switch-on and switch-off times.

In a preferred embodiment, the control unit 18 for this purpose is arranged to control a power semiconductor switching element, e.g. the IGBT switch 7 of the main switch 6 of the hybrid DC power switch 1 according to FIG. 1, between the switch-on and the final switch-off with a control voltage on at least one intermediate level, which is below that of the increased control voltage during the switched-on state, but above the maximum permissible control voltage specified for continuous operation. For example, FIG. 4b illustrates an advantageous switch-off process for an IGBT, e.g. the main switch 6, in which firstly the increased gate-emitter voltage VGE of 50V is applied, and then an increased gate voltage above 20V is switched to, here e.g. 30V, before a voltage of −5V is finally switched to at the gate in order to switch off the switch permanently. The stepped switching of the gate voltage also allows a reduction in the collector current change speed di/dt and the voltage increase dvCE/dt. As can be seen from the slightly rising course of VCE shortly before its steeper rise, the intermediate stage at 30V further causes the IGBT to be desaturated more strongly, whereby both the IGBT collector current and the interrupting voltage peak of VCE are limited. The provision of one or more intermediate stages for the gate voltage VGE supports the safe switch-off of even very large currents, up to ten times the nominal operating current.

Yet other steps can be taken to support the safe switch-off of an IGBT, and thus e.g. the main switch 6 in FIG. 1, even at very high collector currents. For example, for the control of the gate and for the switch-on and switch-off with different gate resistances, various driver stages can be provided, which can be selected individually depending on the load current, voltage and temperature to prevent critical operating conditions, e.g. surge voltages, over-currents and oscillations, to optimize the switching operations dependent on time and to reduce switching losses. Further, a surge voltage limit (so-called active clamping) can be used to reduce the collector current change rate di/dt and also the maximum value of the collector-emitter voltage by a feedback of the collector-emitter voltage on the control input of the IGBT during the switch-off process. Further, the collector current change rate di/dt can be controlled or reduced actively to e.g. reduce the load on the free-wheeling diode. Likewise, the collector-emitter-voltage change rate can be controlled or reduced. A soft switch-off can also be accomplished by a continuous reduction of the gate-emitter voltage VGE.

Advantageously, the control voltage or gate-emitter voltage VGE to be selected can be selected appropriately according to the presettable lifetime and the estimated operating parameters. It is known that the lifetime until breakthrough of the gate oxide layer depends on the field strength at the oxide layer, the temperature of the oxide layer, the semiconductor area and the change in enthalpy from a stable state to an energized transition state for the breakthrough. The field strength at the oxide layer corresponds to the quotient of the applied gate voltage VGE and the oxide thickness of the gate oxide layer. Calculations and simulations have shown that doubling the gate voltage from usually 15V to 30V reduces the lifetime by a factor of around 300. In addition, the dependency of the lifetime of the gate oxide layer until the breakthrough of the gate-emitter voltage appears to be exponential. Thus, the amount of the increased control voltage and gate-emitter voltage VGE depending on a preset lifetime until the breakthrough of the gate oxide layer between the gate G and the emitter E of the power semiconductor switching elements 7 with an estimate of an expected total switch-on time of the power semiconductor switching elements 7 as the sum of the estimated switch-on times of all expected switch-on processes and considering an estimated reduction of the lifetime based on the expected switch-on processes can be selected such that the preset lifetime can be achieved with high probability, without leading to destruction of the power semiconductor switching elements 7. It can be estimated with consideration of the given or intended operating conditions whether, in the given application, a further increase in the gate-emitter voltage is possible, e.g. to +50V or even beyond.

Figure 5:
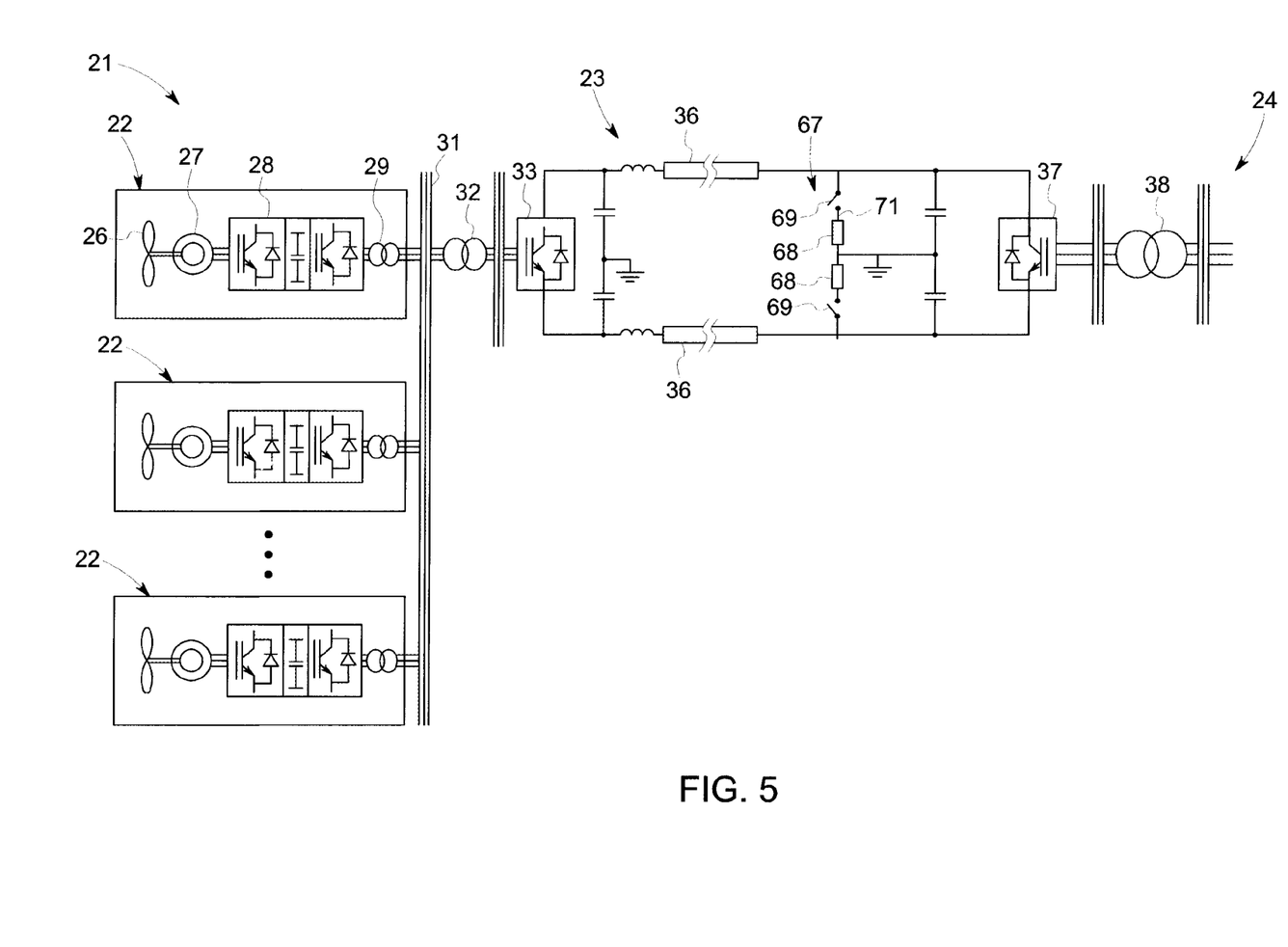
FIG. 5 shows a wind farm with a high-voltage direct current transmission (HVDC) system with devices for on-demand short-term transfer of an electrical current from an energy transmission or distribution device according to further embodiments of the invention.

FIG. 5 shows a further embodiment in which the invention can be used effectively. A wind farm 21 with a number of wind turbines 22 for power generation and a high-voltage direct current (HVDC) transmission system 23 is illustrated, which is used to transmit the power supplied from the wind farm to a downstream AC network 24, e.g. a power distribution network or a public supply network. As is generally known, each wind turbine 22 has rotor blades 26, which convert the kinetic energy of the wind into mechanical energy in a rotating shaft, which is connected to a generator 27. The generator 27 converts the mechanical energy of the shaft into electrical energy, which is then converted by means of power electronics, e.g. a full-scale converter or frequency inverter 28, and a downstream transformer 29, into a suitable voltage and a suitable current for feeding into a common busbar 31 of the wind turbines 22. The busbar voltage, which can be e.g. 33 kV, can then be transformed up by means of a power converter transformer, to e.g. ±150 kV for transmission over the HVDC system 23.

The HVDC system 23 basically comprises a rectifier 33, which converts the three-phase alternating voltage of the power converter transformer 32 into a DC voltage, which is transmitted through DC lines 36 of the HVDC system 23. For example, the lines 36 can transmit DC voltages of 300 kV or more over distances that can be hundreds of kilometers.

The transmitted power on the DC voltage side, which is a high voltage, is converted by an inverter 37 into an alternating voltage, which is a high voltage of e.g. 150 kV, which can be transformed via a power converter transformer 38 into an appropriate voltage of the downstream alternating-voltage network 24.

The rectifier 33 and the inverter 37 are power converters that must be designed for high performance. Various power converter topologies are known. An exemplary topology of a power converter 39 suitable for this purpose is shown in FIG. 6.

The power converter 39 here comprises three phase branches 41a, 41b, 41c, which extend between a positive power bus and a positive DC voltage terminal ("+") 42 of the power converter 39 and a negative power bus and a negative DC voltage terminal ("−") 43. Although here three phase branches 41a-c are illustrated, it is understood that, according to the number of phases in the respective application or circuit environment, only a single phase branch 41 or two or more than three phase branches can be present.

Figure 6:
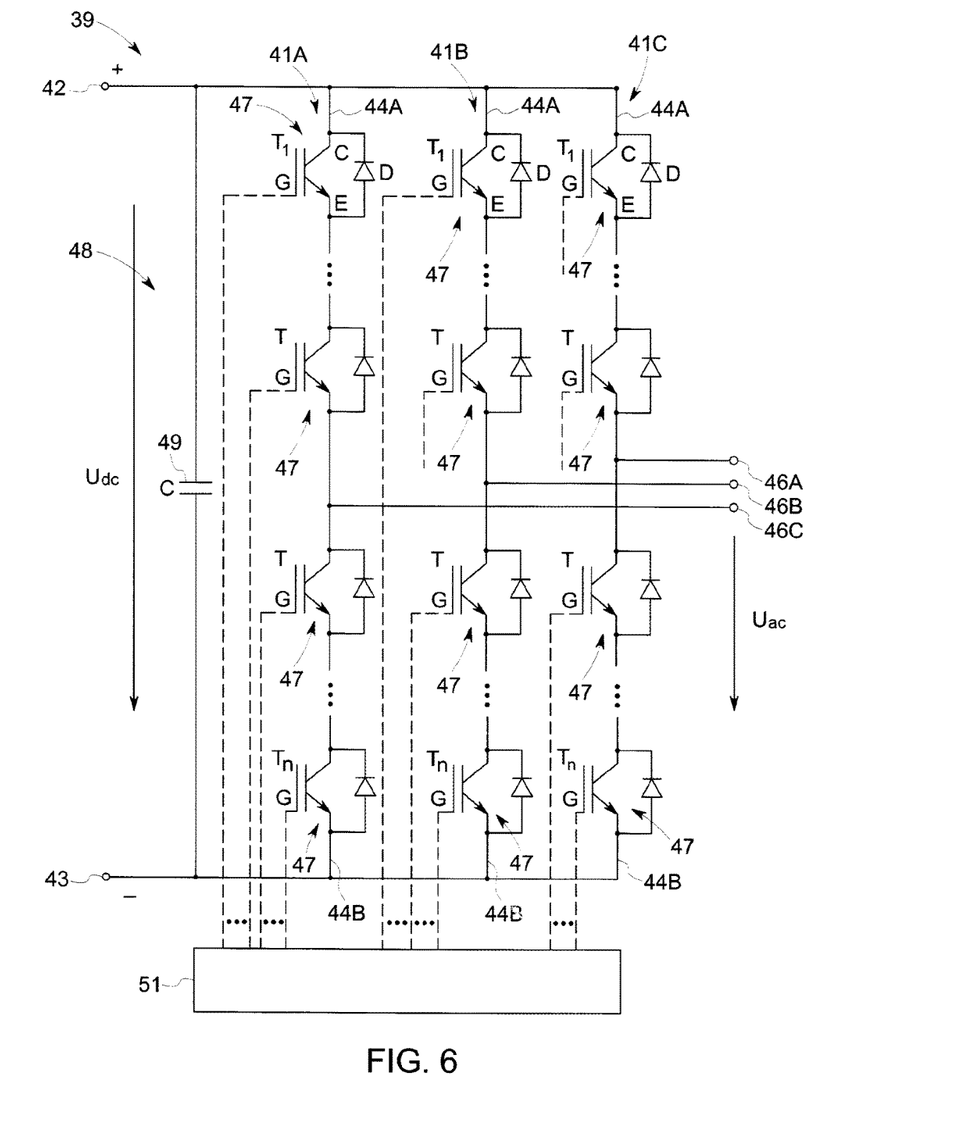
FIG. 6 is a schematic block diagram of an exemplary power converter according to an embodiment of the invention, in a greatly simplified schematic representation.

Each phase branch 41a-c has a first upper branch arm 44a in FIG. 6, and a second lower branch arm associated with it 44b, which are connected together at a connection point that defines the respective alternating voltage terminal 46a, 46b and 46c of the respective phase branch 41a, 41b and 41c. In each branch arm 44a, 44b of each phase branch 41a-c, a series circuit of a number of power semiconductor switching elements 47 (T1 . . . Tn) is arranged in each case, which are designed in common for the respective operating voltages and currents.

Parallel to the phase branches 41a-c, a DC voltage intermediate circuit 48 is provided, which is exemplified here by a DC capacitor C 49 connected between the DC voltage terminals 42, 43.

As illustrated, the power semiconductor switching elements 47 are formed advantageously from IGBTs, which are controlled by a control unit 51 in a specific pulse pattern according to a predetermined modulation method, e.g. by pulse width modulation (PWM), to convert the DC voltage Vdc in the DC voltage intermediate circuit 48 into a here three-phase alternating voltage vac on the alternating-voltage terminals 46a-c, or vice versa. With a variety of IGBTs per branch arm 44a,b, the power converter 39 can be designed with sufficient blocking capacity.

According to the invention, the control unit 51 is here adapted to control the power semiconductor switching elements 47 of the respective series circuits in the respective branch arms 44a,b of the respective phase branches 41a-c respectively with a gate-emitter voltage, which is above the specified maximum control voltage for the power semiconductor switching elements 47 (gate-emitter voltage for IGBTs). At a maximum permissible gate-emitter voltage of 20V, the control unit 51 can here apply, in a similar manner to the embodiment according to FIG. 1, a gate-emitter voltage of e.g. 30V or, if the lifetime permits, 50V, in order to permit higher collector or branch arm currents that can be greater than twice, and even as much as five to ten times, the nominal operating current. In this way, the same power converter can be used for significantly higher powers, or vice versa, for a given nominal operating power, the number of power semiconductor switching elements 47 and the associated semiconductor area can be reduced. As a result, the implementation and operating costs of the power converter 39 and the system in which it is used, e.g. the HVDC system 23 according to FIG. 5, can be reduced.

Although FIG. 5 illustrates an HVDC system 23 for the coupling of the wind farm 21 to the network 24, an MV-DC system for the coupling of wind turbines or photovoltaic systems or drives can also be used according to the invention. In addition, the power converter used is not limited to the power converter type 6 specifically shown in FIG. 6. Rather, a variety of topologies of power converters with two or several stages can be used.

Figure 7:
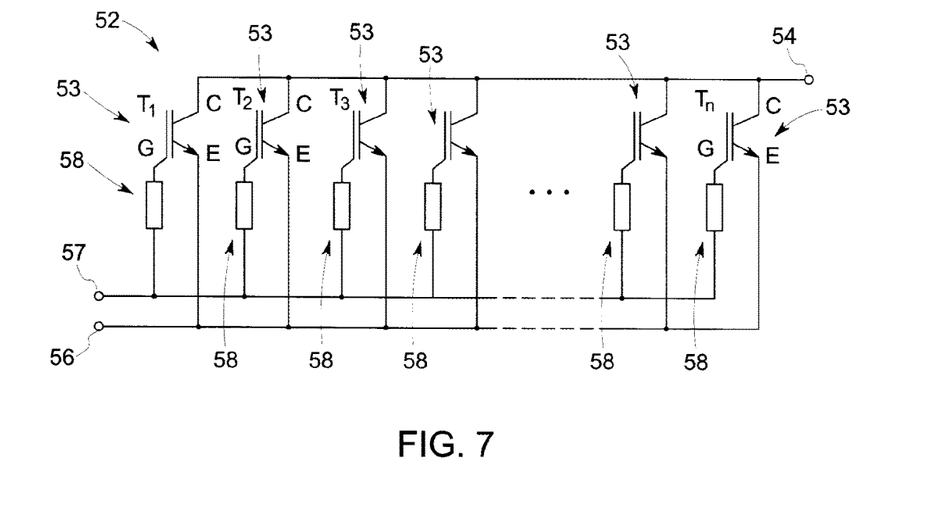
FIG. 7 shows a parallel circuit of a number of power semiconductor components which can be used according to the invention in one of the devices or one of the systems according to FIGS. 1 to 6.

FIG. 7 shows a possible modification that can be applied to the power converter according to FIG. 6 that permits the advantageous use of the step according to the invention for the increase of the gate-emitter voltage beyond the permissible range. FIG. 7 illustrates a power semiconductor module 52 that can replace a series circuit made from power semiconductor switching elements 47 (T1 . . . Tn) in a respective branch arm 44a and 44b of each phase branch 41a-c. The power semiconductor module 52 has a parallel circuit made from semiconductor power switching elements 53 (T1 . . . Tn) connected in parallel to one another between a first terminal 54, with which all the collectors C of the power semiconductor switching elements 53 are connected, a second terminal 56, with which all the emitters E of the power semiconductor switching elements 53 are connected, and a common control or gate terminal 57. The power semiconductor module 52 may comprise any number of at least two mutually parallel IGBTs T1 . . . Tn.

As can further be seen in FIG. 7, a gate resistor can be arranged in each case between the gate electrode G of each IGBT T1 . . . Tn and the common control or gate terminal 57. These resistors 58 can be used for balancing of the circuit to cause all the IGBTs T1 . . . Tn to be able to be switched as simultaneously and uniformly as possible by the control unit 51. The gate series resistors can be arranged together with the IGBTs T1 . . . Tn 53 on the semiconductor chip or even outside of these chips.

As mentioned above, the power semiconductor module 52 can replace a respective series circuit of the number of power semiconductor switching elements 47 of the respective branch arms 44a and 44b. The series circuit of IGBTs is thus replaced by a parallel circuit, whereby each branch arm 44a,b of the power converter 39 is now designed for a larger current. Advantageously, by increasing the gate-emitter voltage VGE above the maximum permissible gate-emitter voltage according to the specification, each of the IGBTs T1 . . . Tn 53 in FIG. 7 are briefly loaded with an increased current that can be two or several, up to ten times the nominal current. Thus, the power converter can be designed for even better performance, or vice versa, for a given power, the number of parallel-connected IGBTs T1 . . . Tn 53 and the associated semiconductor chip area can be reduced, which lowers the implementation and operating costs.

In yet another optional modification, the parallel circuit of the IGBTs T1 . . . Tn according to FIG. 7 respectively can replace a single element of the power semiconductor switching elements 47 in FIG. 6. Thus, each branch arm 44a and 44b has a series circuit made from a number of parallel-connected IGBTs in each case. Such a power converter 39 is suitable for very high load currents and very high voltages, whereby the control according to the invention can be used particularly effectively here to reduce the space requirement, effort and costs.

Figure 8:
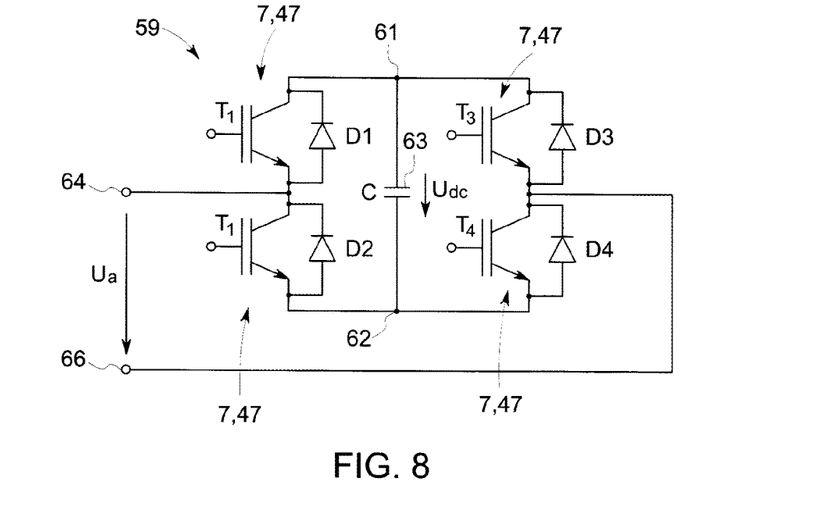
FIG. 8 shows a circuit configuration of a submodule with power semiconductor components which can be used according to the invention in one of the devices or one of the systems according to FIGS. 1 to 6.

FIG. 8 shows a bidirectional submodule 59 which can be used as another option in the power converter 39 according to FIG. 6 to create a modular multistage power converter. The submodule 59 has a full bridge configuration with a series circuit of IGBTs T1, T2 (53), each with antiparallel free-wheeling diodes D1, D2 and a second series circuit of IGBTs T3, T4 (53) with associated antiparallel free-wheeling diodes D3, D4, whereby both series circuits are connected to one another between a first DC voltage node 61 and a second DC voltage node 62. Further, a capacitor C serving as the energy storage 63 is connected in parallel to the two series circuits. The connection points between the IGBTs T1, T2 and T3, T4 of the respective series circuits form a first and second alternating voltage terminal 64 and 66.

The DC voltage vdc across the capacitor C is always positive due to the wiring of the free-wheeling diodes D1-D4 and may, according to the design and application, e.g. be between a few hundred volts and a few kV. The terminal voltage vac between the AC terminals 64, 66 of the submodule 59 can generally assume the values −vdc, +vdc or 0. The DC voltage vdc across the capacitor C can be larger or smaller as already described. A current can, in principle, flow through the submodule 59 in both directions.

The submodule 59 can replace each of the power semiconductor switching elements 47 in the power converter 39 according to FIG. 6, whereby a modular multipoint power converter is created. Due to the modular design, the power converter is individually scalable for different powers and applications. The voltages and currents on the AC and DC side can be controlled and regulated in a highly dynamic way and largely decoupled from one another. Advantageously, the benefits are also increased even further here by brief energization with an increased gate-emitter voltage, which goes beyond the maximum permissible gate-emitter voltage of the IGBT. Vice versa, at the same power, the semiconductor area and size of the power converter 39 can be reduced, which allows the advantages of reducing the effort and the associated costs for the implementation and operation of the power converter 39. To prevent repetitions, reference is made to the above explanations in relation to the hybrid DC power switch according to FIG. 1, whereby the power converter 39 according to FIG. 6, which represents any rectifier (e.g. 33 in FIG. 5), inverter (e.g. 37 in FIG. 5) or frequency inverter (e.g. 28 in FIG. 5), here forms a device 2 for the on-demand short-term transfer of an electrical current according to the invention.

It must further be noted that the power converter according to FIG. 6 must be used with the inventive step of the increased gate-emitter voltage in principle only in applications in which it is only used relatively rarely or for a short time, such that the time to breakthrough of the gate oxide layer of the IGBTs does not exceed the desired lifetime. However, the power converter is suitable for numerous drive systems that are used only for a short time and/or rarely. The required semiconductor area, the size of the power converter 39 and its weight can be reduced significantly by the invention, which is extremely useful in many applications.

A further application of the invention to the power converter 39 can be seen in FIG. 5. FIG. 5 illustrates a so-called chopper resistor device 67, which is connected between the DC voltage lines 36. The chopper resistor device 67 is used to protect against surge voltage of the DC bus capacitance of the inverter 37. For this purpose, the chopper resistor device 67 has a series circuit of at least one resistor 68 and an electronic switch 69, which are arranged in a line branch 71 parallel to the inverter 37. In the present case, two such pairs of the resistor 68 and the electronic switch 69 are arranged symmetrically to a grounded midpoint between the DC lines 36 of the HVDC system 23. If a fault occurs in the AC power network 24, the switches 69 are energized in a pulse-like manner, possibly repeatedly, to dissipate the excess energy or consume it in the resistors 68, thus limiting a DC voltage rise in the intermediate circuit of the inverter 37 to safe levels.

Each electronic switch 69, represented only symbolically in FIG. 5, is preferably formed from a series circuit of power semiconductor switching elements, e.g. similar to the switching elements 7 and 47 in the electronic main switch 6 of the hybrid DC power switch 1 according to FIG. 1 or in the power converter 39 according to FIG. 6. In this way, the electronic switch 69 with the required blocking capacity, in particular for HVDC applications, can be created. The inventive step of increasing the energization or gate-emitter voltage VGE for the individual power semiconductor switching elements 7 and 47 of the switch 69 can here significantly reduce the required semiconductor area and the size of the chopper resistor device 67. Such a chopper resistor device 67 for HVDC applications, e.g. for the HVDC system 23 according to FIG. 5, can reach an enormous size. Advantageously, the invention can reduce this size to a fraction, e.g. one half or even less, of the normal size.

It should be noted that the chopper resistor device 67 is not limited to use in HVDC systems. It can be used e.g. as a brake chopper in drive systems to convert excess energy that flows in the form of a regenerative current from the motor back to the DC intermediate circuit into thermal energy via the braking resistor during braking. The electronic switch, e.g. 69, then switches on the connected resistor, e.g. 68, before the DC intermediate circuit voltage reaches an impermissible level for the components. Once the DC intermediate circuit voltage decreases again and becomes lower than the switch-on voltage, but higher than the network voltage, the switch 69 switches the resistor 68 off again. The process is repeated as soon as the voltage rises again. Even such brake choppers are used for a relatively short time and/or rarely, such that the inventive step of increasing the energization voltage can be used here advantageously over permissible limits.

The person skilled in the art will recognize that, in addition to the illustrated exemplary and particularly preferred applications, other applications will be apparent for the invention, in which a series and/or parallel circuit of power semiconductor switching elements can be energized during normal operation for a relatively short time and/or rarely and/or in a pulse-like manner, such that the use for voltage reduction according to the invention becomes feasible.

A device 2 for the on-demand commutation of an electrical current from a first line branch 14, 3; 36 to another, second line branch 4; 41; 71 is created, which has a number of power semiconductor switching elements 7; 47; 53, which are arranged in series and/or parallel to one another in the second line branch 4; 41; 71, and a control unit 18; 51 for controlling the number of power semiconductor switching elements 7; 47; 53. The control unit 18; 51 is adapted to apply to each of the number of power semiconductor switching elements 7; 47; 53 an increased control voltage VGE whose level is above the maximum permissible control voltage specified for continuous operation, in order to switch on or maintain the conduction of the number of power semiconductor switching elements and to cause an increased current flow through it, whose current rating is at least double the nominal operating current. The control unit 18; 51 is further adapted to control the number of power semiconductor switching elements according to a respectively provided short switch-on duration by switching off the control voltage VGE again while they conduct an increased current flow. The device 2 can be designed for a higher power in operation or, at a given operating power, the semiconductor area and size of the device 2 can be reduced.

What we claim is:

1. A device for the on-demand short-term transfer of an electrical current from an energy transmission or distribution device, the device comprising:
    at least one line branch connected to the energy transmission or distribution device, the at least one line branch comprising a plurality of power semiconductor switching elements arranged in series and/or parallel to one another; and
    a control unit for controlling the plurality of power semiconductor switching elements;
    wherein the control unit switches on the plurality of power semiconductor switching elements by applying an increased control voltage to the plurality of power semiconductor switching elements, the increased control voltage being above a maximum permissible control voltage specified by a manufacturer of the plurality of power semiconductor switching elements for continuous operation of the plurality of power semiconductor switching elements, thereby causing an increased current flow through the plurality of power semiconductor switching elements, the increased current flow being at least double a nominal operating current; and
    wherein the control unit switches off the plurality of power semiconductor switching elements by switching off the increased control voltage while the plurality of power semiconductor switching elements conducts the increased current flow;
    the magnitude of the increased control voltage being dependent on a predetermined total lifetime until a breakdown of an oxide layer of the plurality of power semiconductor switching elements, an estimated total duty cycle of the plurality of power semiconductor switching elements as the sum of the estimated duty times of all expected switch-on processes, and a reduction in lifetime estimated based on the expected switching-on processes to achieve the predetermined lifetime without causing damage to the plurality of power semiconductor switching elements.

2. The device according to claim 1, wherein the increased control voltage is between 1.5 times and 4 times the maximum permissible control voltage.

3. The device according to claim 1, wherein the increased current flow is between a short-circuit current at a recommended control voltage and 27 times the nominal operating current.

4. The device according to claim 1, wherein the energy transmission or distribution device is a high-voltage direct current (HVDC) transmission line, and wherein each of the plurality of power semiconductor switching elements includes at least one insulated gate bipolar transistor (IGBT).

5. The device according to claim 1, wherein the at least one line branch comprises a main current branch and a bypass branch, the main current branch being connected in series to the energy transmission or distribution device, and the bypass branch being connected in parallel to the main current branch;
    wherein the main current branch comprises an electronic auxiliary switch connected in series with a mechanical disconnecting switch; and
    wherein the bypass branch comprises an electronic main switch having a second plurality of power semiconductor switching elements.

6. The device according to claim 5, wherein the electronic auxiliary switch comprises a third plurality of power semiconductor switching elements connected in series, the third plurality of power semiconductor switching elements being arranged for a lower nominal power and for lower conduction losses than the second plurality of power semiconductor switching elements of the electronic main switch.

7. The device of claim 5,
    wherein, in normal operation, the electronic auxiliary switch is switched on conductively, the mechanical disconnecting switch is closed, and a current flows through the main current branch, and
    wherein, when a fault is detected in the energy transmission or distribution device, the electronic auxiliary switch is first opened and the second plurality of power semiconductor switching elements of the electronic main switch are energized with the increased control voltage to commutate the increased current flow to the bypass branch, then the mechanical switch is opened and then the electronic main switch is opened to interrupt the increased current flow in the bypass branch.

8. The device according to claim 1 incorporated in a power converter, wherein the at least one line branch comprises a plurality of parallel-connected branches, whereby each branch of the plurality of parallel-connected branches comprises at least two series-connected electronic switches, which are controlled by the control unit to convert a first power with first current and voltage characteristics into a second power with second current and voltage characteristics.

9. The device according to claim 8, wherein the at least two series-connected electronic switches each comprise a plurality of series-connected and/or parallel-connected power semiconductor switching elements that are controlled in the normal operation of the power converter with the increased control voltage according to a determined pulse pattern.

10. The device according to claim 9, wherein the power converter comprises a chopper resistor device for protection against a surge voltage in a DC intermediate circuit of the power converter,
    wherein the chopper resistor device is connected in parallel to the plurality of parallel branches of the power converter, and has a series circuit of at least one resistor and one electronic switch, whereby the electronic switch is formed from the plurality of series-connected or parallel-connected power semiconductor switching elements which, when the voltage in the DC voltage intermediate circuit exceeds a predetermined threshold, are energized for a short time, in a pulsed manner, and repeatedly with the increased control voltage.

11. The device according to claim 1, wherein the control unit is adapted to energize the plurality of power semiconductor switching elements with a second control voltage, the second control voltage being less than the increased control voltage when the plurality of power semiconductor switching elements is switched on, and greater than the maximum permissible control voltage specified for continuous operation.

* * * * *